(12) United States Patent
Formosa et al.

(10) Patent No.: US 11,352,251 B2
(45) Date of Patent: Jun. 7, 2022

(54) ELECTRONIC DEVICE AND CORRESPONDING MANUFACTURING METHOD

(71) Applicant: STMicroelectronics (Malta) Ltd, Kirkop (MT)

(72) Inventors: Kevin Formosa, Zabbar Zbr (MT); Eftal Saribas, Tarxien (MT)

(73) Assignee: STMicroelectronics (Malta) Ltd, Kirkop (MT)

( * ) Notice: Subject to any disclaimer, the term of this patent is extended or adjusted under 35 U.S.C. 154(b) by 198 days.

(21) Appl. No.: 16/831,302

(22) Filed: Mar. 26, 2020

(65) Prior Publication Data

US 2020/0307991 A1 Oct. 1, 2020

(51) Int. Cl.
| | |
|---|---|
| *H01L 23/02* | (2006.01) |
| *B81B 7/00* | (2006.01) |
| *B81B 7/02* | (2006.01) |
| *H01L 23/04* | (2006.01) |
| *H01L 23/31* | (2006.01) |
| *H01L 23/00* | (2006.01) |

(52) U.S. Cl.
CPC .......... *B81B 7/0061* (2013.01); *B81B 7/0077* (2013.01); *B81B 7/02* (2013.01); *H01L 23/04* (2013.01); *H01L 23/3114* (2013.01); *H01L 24/32* (2013.01); *H01L 24/48* (2013.01); *H01L 24/73* (2013.01); *B81B 2201/02* (2013.01); *B81B 2207/012* (2013.01); *B81C 2203/01* (2013.01); *H01L 2224/32145* (2013.01); *H01L 2224/48091* (2013.01); *H01L 2224/48137* (2013.01); *H01L 2224/73265* (2013.01); *H01L 2924/1433* (2013.01); *H01L 2924/1461* (2013.01); *H01L 2924/1615* (2013.01)

(58) Field of Classification Search
CPC combination set(s) only.
See application file for complete search history.

(56) References Cited

U.S. PATENT DOCUMENTS

| | | | |
|---|---|---|---|
| 6,969,640 B1* | 11/2005 | Dimaano, Jr. ........ | H01L 21/565 257/E21.504 |
| 2004/0189862 A1* | 9/2004 | Gustavsson .......... | H04N 5/2254 348/376 |
| 2009/0243051 A1* | 10/2009 | Vanam .............. | H01L 27/14683 257/659 |

(Continued)

OTHER PUBLICATIONS

IT Search Report and Written Opinion for IT Appl. No. 102019000004827 dated Nov. 20, 2019 (7 pages).

*Primary Examiner* — Niki H Nguyen
(74) *Attorney, Agent, or Firm* — Crowe & Dunlevy

(57) ABSTRACT

An electronic integrated circuit (IC) component is mounted to a substrate. A cap member is applied onto the substrate and covers the electronic IC component. The cap member includes an outer wall defining an opening and an inner wall surrounding the electronic IC component. The inner wall extends from a proximal end at the substrate towards a distal end facing the opening in the outer wall to provide a reception chamber for the electronic IC component and a peripheral chamber between the inner wall and the outer wall of the cap member. An encapsulant material is provided in the reception chamber to seal the electronic IC component without being present in the peripheral chamber.

15 Claims, 1 Drawing Sheet

(56) References Cited

U.S. PATENT DOCUMENTS

2010/0164346 A1* 7/2010 Li .............................. F21V 7/06
　　　　　　　　　　　　　　　　　　　　　　　313/46
2014/0374848 A1* 12/2014 Koh ........................ H01L 24/97
　　　　　　　　　　　　　　　　　　　　　　257/415
2018/0313709 A1* 11/2018 Chiou ................... B81B 3/0021

* cited by examiner

ELECTRONIC DEVICE AND CORRESPONDING MANUFACTURING METHOD

PRIORITY CLAIM

This application claims the priority benefit of Italian Application for Patent No. 102019000004827, filed on Apr. 1, 2019, the content of which is hereby incorporated by reference in its entirety to the maximum extent allowable by law.

TECHNICAL FIELD

The description relates to electronic devices.

One or more embodiments may be applied to encapsulated ASIC/MEMS sensors.

ASIC and MEMS are well-known acronyms for Application Specific Integrated Circuit and Micro Electro-Mechanical Systems.

BACKGROUND

The continuous demand for smaller and thinner packages of electronic devices induces manufacturing challenges involving a trade-off between securing good encapsulation of electronic IC components (MEMS plus ASIC plus wires, for instance) and a cap seal joint.

Also, avoiding undesired swelling of encapsulation material (gel, for instance) out of a package during package manufacturing, subsequent thermal processing and/or device mounting on board may represent another critical issue to be addressed.

SUMMARY

In an embodiment, an electronic device comprises a single component part (a cap, for instance) providing a chamber for a filling of encapsulant material which is isolated from the outer surface of an electronic IC component mounted to a substrate. The component part is defined by a structure providing a cap member that includes: an outer wall having a opening therein and an inner wall surrounding the electronic IC component, said inner wall extending from a proximal end at the substrate towards a distal end facing said opening in the outer wall to provide a reception chamber for the electronic IC component within the inner wall and further provide a peripheral chamber between the inner wall and the outer wall of the cap member, wherein the peripheral chamber of the cap member surrounds the reception chamber

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
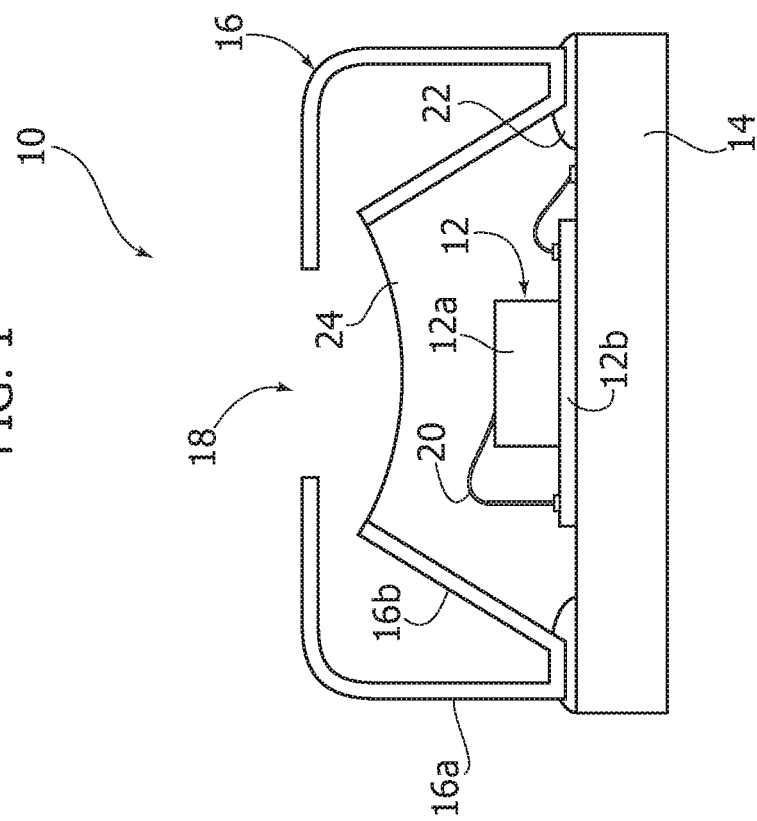
FIG. 1 is a cross-sectional view across a device according to embodiments.

Reference 10 in FIG. 1 denotes an electronic device including at least one electronic integrated circuit (IC) component 12 arranged on a substrate 14.

The device 10 as exemplified in FIG. 1 may also include a cap member 16 applied onto the substrate 14 and covering the at least one electronic IC component 12 arranged thereon.

As exemplified in FIG. 1, the cap member 16 has an opening 18 arranged at (above, for instance) the at least one electronic IC component 12.

One or more embodiments as exemplified in FIG. 1 may comprise a combination of electronic IC components such as, for instance, a sensor 12a (a MEMS sensor may be exemplary of such a sensor) and a companion electronic circuit such as an integrated circuit 12b (an ASIC may be exemplary of such a circuit).

Certain commercial products currently available from various manufacturers such as, for instance MURATA (as included in iWATCH 3), PAX (TE Connectivity) and Huawey (GoerTek-GTK) are exemplary of electronic devices as considered herein.

In one or more embodiments as exemplified in FIG. 1 the "first" IC component 12a may be mounted on the "second" IC component 12b in a stacked arrangement.

Such a stacked arrangement of plural IC components (two or more) is not however mandatory for the embodiments.

For instance, in one or more embodiments the "first" IC component 12a and the "second" IC component (and possibly other components) may be arranged side-by-side. Mixed arrangements (that is stacked and side-by-side) are also possible.

Also, as exemplified in FIG. 1, electrically-conductive formations 20 (for instance a wire bonding pattern, as conventional in the art) may be provided to electrically couple the IC components 12a, 12b to each other as well as to the substrate 14.

In one or more embodiments, the substrate 14 may comprise a Printed Circuit Board (PCB) type substrate as conventional in the art.

High accuracy, low power consumption, temperature stability and waterproofing (IPx protection grade, for instance) as well as a smaller and thinner package may represent desirable features for a device 10 as exemplified in FIG. 1.

Protection from the outside environment (waterproofing, for instance) may be facilitated by attaching a metal cap 16 to the substrate 14 via an adhesive 22 such as an epoxy adhesive with the electronic IC component(s) (and possibly the sealing adhesive 22) encapsulated in an encapsulating material.

A waterproofing gel is used to provide waterproofing and resistance to chemicals as well as sea/pool water, soaps and common detergents. A wide variety of encapsulating materials such as (liquid) polymeric encapsulants like silicones or urethanes are currently available from various supply sources such as Dow Silicones, Henkel, Elantas, Lord, H. B. Fuller.

Providing an effective amount of such encapsulating material (a gel, for instance) may turn out to be a critical step insofar as a risk may arise of having the encapsulant material swelling out of the opening 18 (or in close proximity to the package surface/opening 18)

This is even more the case with the growing tendency to provide thinner packages.

The intrinsic properties of the encapsulant material such as a gel make it susceptible to damage by contact and difficult to prevent that material from seeping (oozing) to the top surface of the cap during the package manufacturing process and/or subsequent thermal processes (which may possibly lead to material expansion).

In one or more embodiments as exemplified herein, the cap member 16 may comprise an outer wall 16a having an opening 18 provided therein (at a central position of the top or front surface of the device 10, for instance) and an inner wall 16b surrounding the electronic IC component or components 12a, 12b (briefly, 12 as a whole) and having a further opening facing the opening 18.

As exemplified herein, the inner wall 16b of the cap 16 may extend from a proximal end at (near or abutting against) the substrate 14 towards a distal end at the further opening which faces the opening 18 in the outer wall 16a.

As exemplified herein, the cap member 16 thus includes a (central, for instance) reception chamber for the electronic IC component or components 12 (as provided by the inner wall 16b) and a peripheral chamber between the inner wall 16b and the outer wall 16a of the cap 16 with the peripheral chamber surrounding the reception chamber for the electronic IC component(s) 12.

A filling of encapsulant material 24 (of any conventional type in the art) may thus be provided (only or primarily) in the reception chamber for the electronic IC component(s) 12.

In one or more embodiments as exemplified herein, the inner wall 16b may have a tapered shape with a proximal end (at the substrate 14) wider than the distal end (facing the opening 18), opposite the substrate 14.

In one or more embodiments as exemplified herein, the distal end of the inner wall 16b (that is, the end of the inner wall 16b away from the substrate 14) may be arranged facing the opening 18 in the outer wall 16a by leaving a gap between the further opening and said opening 18 in the outer wall.

As exemplified herein, the filling of encapsulant material 24 in the reception chamber provided by the inner wall 16b may have a concave (meniscus-like, for instance) distal surface with a concavity facing towards the opening 18.

In one or more embodiments as exemplified herein, the outer wall 16a and the inner wall 16b of the cap 16 may have respective proximal ends adjoining at (that is near or in abutment against) the substrate 14.

A cap member 16 as exemplified herein may be manufactured by resorting to various technologies.

Additive manufacturing (3D printing), stamping or cold forming are exemplary of such possible technologies.

In one or more embodiments the two portions (walls) of the cap member 16 may be manufactured as a one-piece (or integral) structure.

One or more embodiments may thus provide a dual-chamber arrangement including a central reception chamber having the electronic IC component(s) 12 encapsulated therein by an encapsulating material 24 (which substantially fills the central reception chamber) and an external chamber which fits the end application requirements thus leading to a solution exhibiting improved robustness in comparison with current solutions.

In one or more embodiments, the cap 16 may comprise an annular body with annular outer and inner walls 16a, 16b so that the peripheral chamber surrounding the inner wall 16b may be generally ring-shaped.

In one or more embodiments as exemplified in FIG. 1 the inner wall 16b of the cap 16 may include a frusto-conical shape.

Figure 2:
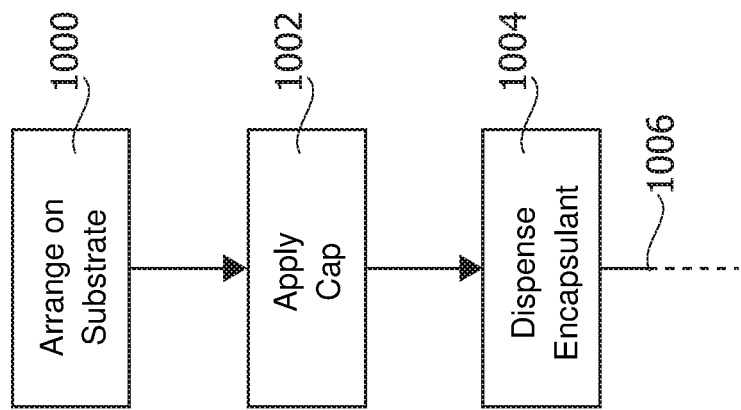
FIG. 2 is a flowchart for certain processing steps of a manufacturing process.

As shown in FIG. 2, a manufacturing process of a device 10 as exemplified herein may include a number of process steps.

A process step as exemplified by block 1000 in FIG. 2 may include arranging the electronic IC component(s) 12 on the substrate 14 (possibly in a stacked arrangement as shown and/or arranged side-by-side).

Another process step as exemplified by block 1002 in FIG. 2 may include applying the cap member 16 onto the substrate 14 having the electronic IC component(s) 12 arranged thereon.

This may involve, for instance, locating the opening 18 in the cap member 16 at (above, for instance) the electronic IC component(s). Such an option may be advantageous, for instance, in the case of a component 12a such as a sensor (a MEMS sensor, for instance) where some sort of (protected) exposure to the opening 18 may be desirable.

Still another act as exemplified by block 1004 involves dispensing a filling of encapsulant material 24 through said opening 18 and the further opening in the inner wall into the reception chamber (that is within the inner wall 16b) so that the electronic IC component(s) 12 therein may be (fully) encapsulated by the material 24.

Dispensing a filling of encapsulant material 24 in the reception chamber within the inner wall 16b will facilitate leaving the peripheral chamber between the inner wall 16b and the outer wall 16a substantially free from encapsulant material 24. The risk for the material 24 to undesirably seep (ooze) out of the opening 18 will thus be reduced.

Other steps as indicated at 1006 in FIG. 2 may involve processing steps such as a thermal processing, device mounting on board and so on, as conventional in the art.

An electronic device as exemplified herein (for instance, 10) may comprise:
  at least one electronic IC component (for instance, 12, 12a, 12b) arranged on a substrate (for instance, 14),
  a cap member (for instance, 16) applied onto the substrate and covering the at least one electronic IC component arranged thereon, the cap member having an opening (for instance, 18) at the at least one electronic IC component,
  an encapsulant material (for instance, 24) filling in the cap member, the encapsulant material sealingly encapsulating the at least one electronic IC component arranged on the substrate, wherein:
the cap member comprises an outer wall (for instance, 16a) having said opening therein and inner wall (for instance, 16b) surrounding the at least one electronic IC component,
the inner wall extends from a proximal end at the substrate towards a distal end facing said opening in the outer wall to provide a (central, for instance) reception chamber for the at least one electronic IC component within the inner wall and a peripheral chamber between the inner wall and the outer wall of the cap member, wherein the peripheral chamber of the cap member surrounds the reception chamber for the at least one electronic IC component, and
the encapsulant material is provided to substantially fill in the reception chamber for the at least one electronic IC component, that is with the peripheral chamber between the outer wall and the inner wall of the cap member substantially free from encapsulant material.

In a device as exemplified herein, the inner wall may have a tapered shape with said proximal end wider than said distal end.

In a device as exemplified herein, the distal end of the inner wall may be arranged facing said opening in the outer wall by leaving a gap thereto.

In a device as exemplified herein, the encapsulant material filling the reception chamber for the at least one electronic IC component may have a concave (for instance, meniscus-like) distal surface with a concavity towards the opening in the outer wall.

In a device as exemplified herein, the outer wall and the inner wall of the cap member may have respective proximal ends adjoining at the substrate.

A device as exemplified herein may comprise cap attachment material at the proximal end of the inner wall of the cap member.

In a device as exemplified herein, the cap member may comprise an annular body with annular outer and inner walls.

A device as exemplified herein may comprise a frusto-conical inner wall of the cap member.

In a device as exemplified herein, the at least one electronic IC component may comprise either or both of a sensor, optionally a MEMS, and a semiconductor chip, optionally an ASIC.

A method of manufacturing a device as exemplified herein may comprise:
arranging (for instance, 1000) said at least one electronic IC component on said substrate,
applying (for instance, 1002) onto the substrate having the at least one electronic IC component arranged thereon said cap member by locating the opening in the cap member at the at least one electronic IC component, and
dispensing (for instance, 1004) an encapsulant material that substantially (only) fills the reception chamber for the at least one electronic IC component while leaving the peripheral chamber between the outer wall and the inner wall of the cap member substantially free from encapsulant material.

Without prejudice to the underlying principles, the details and embodiments may vary, even significantly, with respect to what has been described by way of example only, without departing from the scope of protection.

The claims are an integral part of the technical disclosure of embodiments as provided herein.

The extent of protection is determined by the annexed claims.

The invention claimed is:

1. A device, comprising:
an electronic integrated circuit (IC) component arranged on a substrate;
a cap member applied onto the substrate and covering the electronic IC component, wherein the cap member comprises:
an outer wall having a first opening therein and an inner wall surrounding the electronic IC component, said inner wall extending from a proximal end at the substrate towards a distal end facing said first opening in the outer wall to provide a reception chamber for the electronic IC component within the inner wall and further provide a peripheral chamber between the inner wall and the outer wall of the cap member, wherein the peripheral chamber of the cap member surrounds the reception chamber; and
an encapsulant material in the cap member, the encapsulant material provided in the reception chamber to sealingly encapsulate the electronic IC component arranged on the substrate.

2. The device of claim 1, wherein the inner wall has a tapered shape with said proximal end wider than said distal end.

3. The device of claim 1, wherein the distal end of the inner wall is arranged to form a second opening facing said first opening in the outer wall and having a gap between the first and second openings.

4. The device of claim 1, wherein the encapsulant material filling the reception chamber has a concave distal surface with a concavity towards the first opening in the outer wall.

5. The device of claim 1, wherein the outer wall and the inner wall of the cap member have respective proximal ends adjoining at the substrate.

6. The device of claim 1, further comprising a material configured to attach the proximal end of the inner wall of the cap member to the substrate.

7. The device of claim 1, wherein the cap member comprises an annular body with annular outer and inner walls, said annular outer wall including said first opening and said annular inner wall defining a second opening facing said first opening.

8. The device of claim 7, wherein the inner wall has a frusto-conical shape.

9. The device of claim 1, wherein the electronic IC component comprises at least one of a sensor and a semiconductor chip.

10. The device of claim 9, wherein the sensor is a MEMS.

11. The device of claim 9, wherein the semiconductor chip is an ASIC.

12. The device of claim 1, wherein the peripheral chamber between the outer wall and the inner wall of the cap member is substantially free from encapsulant material.

13. A method of manufacturing, comprising:
arranging an electronic integrated circuit (IC) component on a substrate;
applying a cap member onto the substrate, wherein the cap member comprises:
an outer wall having a first opening therein and an inner wall surrounding the electronic IC component, said inner wall extending from a proximal end at the substrate towards a distal end having a second opening facing said first opening in the outer wall to provide a reception chamber for the electronic IC component within the inner wall and further provide a peripheral chamber between the inner wall and the outer wall of the cap member, wherein the peripheral chamber of the cap member surrounds the reception chamber; and dispensing an encapsulant material through the first and second openings into the reception chamber while leaving the peripheral chamber between the outer wall and the inner wall of the cap member substantially free from encapsulant material.

14. The method of claim 13, wherein the encapsulant material filling the reception chamber has a concave distal surface with a concavity towards the opening in the outer wall.

15. The method of claim 14, further comprising attaching the proximal end of the inner wall of the cap member to the substrate.

* * * * *